(12) United States Patent
Cho et al.

(10) Patent No.: US 11,367,847 B2
(45) Date of Patent: Jun. 21, 2022

(54) DISPLAY PANEL, DISPLAY DEVICE AND MANUFACTURING METHOD

(71) Applicants: HKC CORPORATION LIMITED, Shenzhen (CN); CHONGQING HKC OPTOELECTRONICS TECHNOLOGY CO., LTD., Chongqing (CN)

(72) Inventors: En-Tsung Cho, Chongqing (CN); Hejing Zhang, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 463 days.

(21) Appl. No.: 16/341,448

(22) PCT Filed: Nov. 8, 2018

(86) PCT No.: PCT/CN2018/114558
§ 371 (c)(1),
(2) Date: Apr. 12, 2019

(87) PCT Pub. No.: WO2020/093310
PCT Pub. Date: May 14, 2020

(65) Prior Publication Data
US 2021/0343963 A1    Nov. 4, 2021

(30) Foreign Application Priority Data

Nov. 5, 2018   (CN) .......................... 201811306336.5

(51) Int. Cl.
*H01L 51/50*   (2006.01)
*H01L 27/12*   (2006.01)
(Continued)

(52) U.S. Cl.
CPC ........ *H01L 51/502* (2013.01); *H01L 27/1225* (2013.01); *H01L 27/156* (2013.01);
(Continued)

(58) Field of Classification Search
CPC ........ H01L 51/502; H01L 33/06; H01L 33/08
See application file for complete search history.

(56) References Cited

U.S. PATENT DOCUMENTS 6,632,694 B2    10/2003   Torvik
2008/0121955 A1  5/2008   Shieh et al.
(Continued)

FOREIGN PATENT DOCUMENTS

CN    101057008 A    10/2007
CN    101379222 A    3/2009
(Continued)

OTHER PUBLICATIONS

International Search Report issued in corresponding international application No. PCT/CN2018/114558, dated Jul. 18, 2019.
(Continued)

*Primary Examiner* — Changhyun Yi

(57) ABSTRACT

The present application discloses a display panel, a display device and a manufacturing method. The display panel includes light-emitting diodes. The light-emitting diodes includes a blue luminescent layer. The blue luminescent layer includes a germanium silicon quantum dot material. A proportion range of a silicon element in the light-emitting diodes is 65%-90%, and a proportion range of a germanium element is 10%-35%.

18 Claims, 8 Drawing Sheets

(51) Int. Cl.
  *H01L 27/15*    (2006.01)
  *H01L 27/32*    (2006.01)
  *H01L 29/04*    (2006.01)
  *H01L 29/786*   (2006.01)
  *H01L 33/00*    (2010.01)
  *H01L 33/06*    (2010.01)
  *H01L 33/08*    (2010.01)
  *H01L 33/18*    (2010.01)
  *H01L 33/34*    (2010.01)
  *H01L 51/56*    (2006.01)
  *H01L 33/14*    (2010.01)

(52) U.S. Cl.
  CPC .......... *H01L 27/3244* (2013.01); *H01L 29/04* (2013.01); *H01L 29/7869* (2013.01); *H01L 29/78696* (2013.01); *H01L 33/0054* (2013.01); *H01L 33/06* (2013.01); *H01L 33/08* (2013.01); *H01L 33/18* (2013.01); *H01L 33/34* (2013.01); *H01L 51/5044* (2013.01); *H01L 51/56* (2013.01); *H01L 33/14* (2013.01); *H01L 2227/323* (2013.01)

(56) References Cited

U.S. PATENT DOCUMENTS

2017/0278894 A1* 9/2017 Sato .................... G09F 9/33
2018/0046013 A1* 2/2018 Jiang ............... G02F 1/136209

FOREIGN PATENT DOCUMENTS

| | | |
|---|---|---|
| CN | 103903966 A | 7/2014 |
| CN | 105720202 A | 6/2016 |
| CN | 107689388 A | 2/2018 |
| CN | 108022976 A | 5/2018 |
| CN | 108376695 A | 8/2018 |
| CN | 108415193 A | 8/2018 |
| CN | 109585503 A | 4/2019 |
| KR | 20120027967 A | 3/2012 |

OTHER PUBLICATIONS

Written opinion of the International Search Authority in corresponding International application No. PCT/CN2018/114558, dated Jul. 18, 2019.
First Office Action from China patent office in a counterpart Chinese patent Application 201811306336.5, dated Sep. 4, 2020 (7 pages).

* cited by examiner

DISPLAY PANEL, DISPLAY DEVICE AND MANUFACTURING METHOD

The present application claims priority to the Chinese Patent Application No. CN201811306336.5, filed with the Chinese Patent Office on Nov. 5, 2018, and entitled "DISPLAY PANEL, DISPLAY DEVICE AND MANUFACTURING METHOD", which is incorporated herein by reference in its entirety.

TECHNICAL FIELD

The present application relates to the technical field of the display and in particular to a display panel, a display device and a manufacturing method.

BACKGROUND

The description herein only provides background information related to the present application, and not intended to form the prior art necessarily.

Displays known by an inventor are generally controlled on the basis of the active switches, have the numerous advantages of thin machine body, power-saving, no radiation and the like, and are extensively applied. The displays mainly include a liquid crystal display, an organic light-emitting diodes (OLED) display, a quantum dot light emitting diodes (QLED) display, a plasma display and the like, from the view of an appearance structure, the displays include a plane-type display and a curve-type display.

With regard to the liquid crystal display, the liquid crystal display includes two parts of a liquid crystal display panel and a backlight module, a working principle of the liquid crystal display is that liquid crystal is placed between two pieces of parallel glass substrates, and a driving voltage is applied to the two pieces of the glass substrates to control a rotation direction of the liquid crystal, so that a light ray of the backlight module is refracted to generate a picture.

With regard to the OLED display, the OLED display is capable of performing display by using self-luminescence of an organic light-emitting diodes, and has the advantages of the self-luminescence, a wide viewing angle, a nearly infinite high contrast ratio, lower power consumption, a high response speed and the like. Compared with an organic fluorescent luminophore, the luminescence based on a quantum dot has the advantages of high color purity, long service life, easy dispersion and the like, and a printing technology may be adopted for preparing, the QLED is generally considered as a powerful competitor for the next generation of a display technology. The QLED is not high in composite efficiency, and short in service life.

SUMMARY

The present application aims to provide a display panel, so as to improve the performance of a transistor.

The purpose of the present application is realized by the following technical scheme:

According to one aspect of the present application, the present application discloses a display panel, including: a substrate; active switches, formed on the substrate; a color filter layer, formed on the active switches; a first electrode layer, formed on the color filter layer; light-emitting diodes, formed on the first electrode layer; a second electrode layer, formed on the light-emitting diodes; an encapsulation layer, formed on the second electrode layer; the light-emitting diodes includes a germanium silicon quantum dot material; and a proportion range of a silicon element in the light-emitting diodes is 65%-90%, and a proportion range of a germanium element is 10%-35%.

Optionally, the light-emitting diodes further includes: an electron injection layer, electrically connected with the negative electrode layer; a first electron transport layer, formed on the electron injection layer; a red/green luminescent layer, formed on the first electron transport layer; a first hole transport layer, formed on the red/green luminescent layer; an intermediate connection layer, formed on the first hole transport layer; a second electron transport layer, formed on the intermediate connection layer, where a blue luminescent layer is formed on the electron transport layer; a second hole transport layer, formed on the blue luminescent layer; and a hole injection layer, formed on the second hole transport layer, and electrically connected with the positive electrode layer.

Optionally, the blue luminescent layer includes a silicon dioxide framework, the germanium silicon quantum dot material is formed in the silicon dioxide framework, the silicon dioxide framework includes a plurality of cylindrical holes, the holes pass through the silicon dioxide framework, and the holes are filled with the germanium silicon quantum dot material.

Optionally, the holes are arranged in a hexagon rule.

Optionally, a diameter range of the holes is 2-7 nanometers; and a wall thickness of the holes is 1-2 nanometers.

Optionally, the red/green luminescent layer includes a silicon dioxide framework, the germanium silicon quantum dot material is formed in the silicon dioxide framework, the silicon dioxide framework includes a plurality of cylindrical holes, the holes pass through the silicon dioxide framework, and the holes are filled with the germanium silicon quantum dot material.

Optionally, the light-emitting diodes further includes: an electron injection layer electrically connected with the negative electrode layer, an electron transport layer formed on the electron injection layer, a red/green luminescent layer formed on the electron transport layer, a first hole transport layer formed on the red/green luminescent layer, an intermediate connection layer formed on the first hole transport layer, an electron transport layer formed on the intermediate connection layer, where a blue luminescent layer is formed on the electron transport layer, a second hole transport layer formed on the blue luminescent layer, and a hole injection layer formed on the second hole transport layer, where the hole injection layer is electrically connected with the positive electrode layer; the blue luminescent layer includes a silicon dioxide framework, the germanium silicon quantum dot material is formed in the silicon dioxide framework, the silicon dioxide framework includes a plurality of cylindrical holes, the holes pass through the silicon dioxide framework, and the holes are filled with the germanium silicon quantum dot material, the holes are arranged in a hexagon rule, a diameter range of the holes is 2-7 nanometers; and a wall thickness of the holes is 1-2 nanometers.

Optionally, the active switches includes: a source electrode and a drain electrode, formed on the substrate of the display panel; two protecting layers, formed on the substrate and partially covering the source electrode and the drain electrode, where a groove structure is formed between the two protecting layers; a semiconductor layer, disposed between the two protecting layers, and connecting the source electrode and the drain electrode; a dielectric layer, disposed between the two protecting layers, and formed on the semiconductor layer; a gate electrode, formed on the dielectric layer; a passivation layer, formed on the gate electrode; and the semiconductor layer includes a silicon dioxide framework, and a synthetic Nano-materials containing an indium gallium zinc oxide is internally disposed in the silicon dioxide framework.

According to another aspect of the present application, the present application further discloses a manufacturing method for a display panel, and includes the following steps:

forming active switches on a substrate;
forming a color filter layer on the active switches;
forming a first electrode layer on the color filter layer;
forming light-emitting diodes on the first electrode layer;
forming a second electrode layer on the light-emitting diodes;
forming an encapsulation layer on the second electrode layer; and
where the light-emitting diodes includes a blue luminescent layer, and the blue luminescent layer includes a germanium silicon quantum dot material.

Optionally, the step of forming the light-emitting diodes on the first electrode layer includes a manufacturing method for the blue luminescent layer:

forming glue beams;
enabling the glue beams to form glue beam rods;
enabling the glue beam rods to be arranged in hexagon so as to form a hexagonal matrix;
enabling the hexagonal matrix to form a template intermediate group according to an organic molecule template self-assembly mechanism;
roasting the template intermediate group to remove a template so as to form a silicon dioxide framework; and
filling the silicon dioxide framework with a germanium silicon quantum dot material.

According to another aspect of the present application, the present application further discloses a display device, and the display device includes any one of the above display panels.

The present application adopts a silicon dioxide framework self-assembly molecule template technology, mesoporous silica has a specific pore canal structure, and is hollow, small in density and large in specific surface area, so the mesoporous silica has the unique permeability, the molecule sieving capacity, the optical property and the adsorbability, features of the blue luminescent layer may be remarkably improved, and a germanium material is high in electronic mobility, the light-emitting efficiency of the QLED may be improved, so the conductivity of a backlight source of the QLED may be effectively improved by the combination of two parties, thereby the composite performance of the QLED is improved, and the service life of the QLED is improved.

BRIEF DESCRIPTION OF DRAWINGS

The drawings are included to provide further understanding of embodiments of the present application, which constitute a part of the specification and illustrate the embodiments of the present application, and describe the principles of the present application together with the text description. Apparently, the accompanying drawings in the following description show merely some embodiments of the present application, and a person of ordinary skill in the art may still derive other accompanying drawings from these accompanying drawings without creative efforts.

In the accompanying drawings.

DETAILED DESCRIPTION

Figure 1:
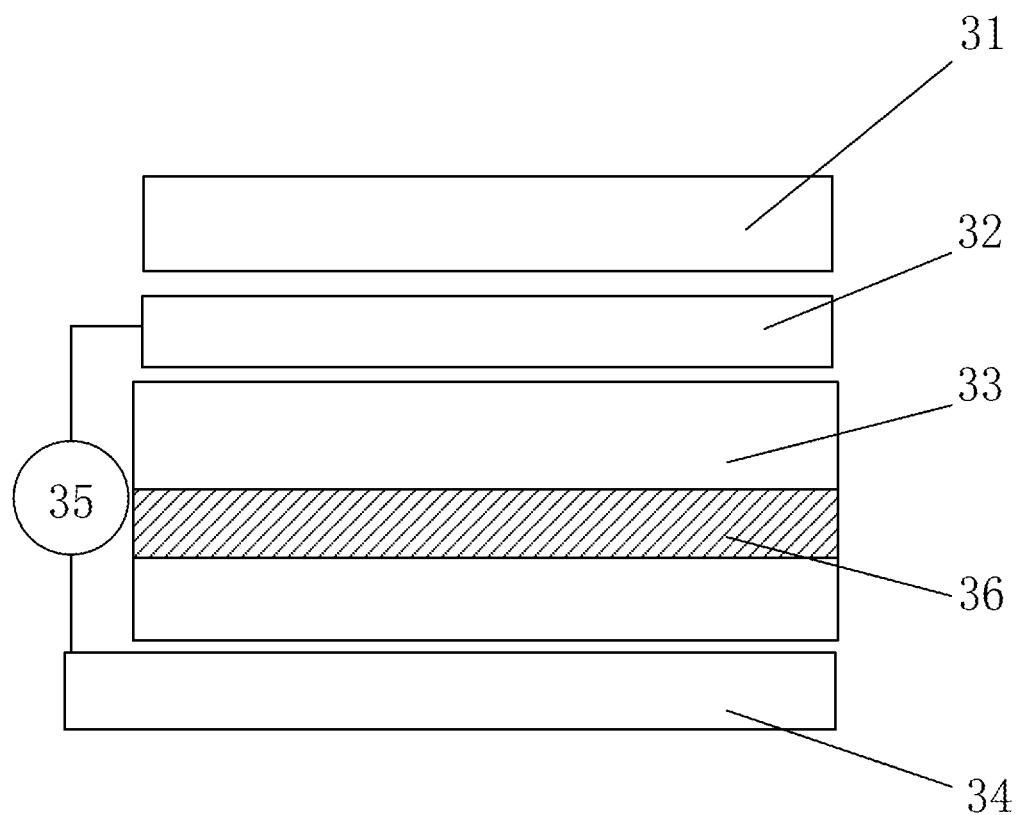
FIG. 1 is a structure schematic diagram of a display panel of one embodiment of the present application.

The specific structure and function details disclosed herein are merely representative, and are intended to describe exemplary embodiments of the present application. However, the present application may be specifically embodied in many alternative forms, and should not be interpreted to be limited to the embodiments described herein.

In the description of the present application, it should be understood that, orientation or position relationships indicated by the terms "center", "transversal", "upper", "lower", "left", "right", "vertical", "horizontal". "top", "bottom", "inner", "outer", etc. are based on the orientation or position relationships as shown in the drawings, for ease of the description of the present application and simplifying the description only, rather than indicating or implying that the indicated device or element must have a particular orientation or be constructed and operated in a particular orientation. Therefore, these terms should not be understood as a limitation to the present application. In addition, the terms such as "first" and "second" are merely for a descriptive purpose, and cannot be understood as indicating or implying relative importance, or implicitly indicating the number of the indicated technical features. Hence, the features defined by "first" and "second" may explicitly or implicitly include one or more features. In the description of the present application, "a plurality of" means two or more, unless otherwise stated. In addition, the term "include" and any variations thereof are intended to cover a non-exclusive inclusion.

In the description of the present application, it should be understood that, unless otherwise specified and defined, the terms "install", "connected with", "connected to" should be comprehended in a broad sense. For example, these terms may be comprehended as being fixedly connected, detachably connected or integrally connected; mechanically connected or coupled; or directly connected or indirectly connected through an intermediate medium, or in an internal communication between two elements. The specific meanings about the foregoing terms in the present application may be understood by those skilled in the art according to specific circumstances. The terms used herein are merely for the purpose of describing the specific embodiments, and are not intended to limit the exemplary embodiments. As used herein, the singular forms "a", "an" are intended to include the plural forms as well, unless otherwise indicated in the context clearly. It will be further understood that the terms "comprise" and/or "include" used herein specify the presence of the stated features, integers, steps, operations, elements and/or components, but do not preclude the presence or addition of one or more other features, integers, steps, operations, elements, components and/or combinations thereof.

The mode of execution is optionally described below in detail in combination with the drawings 1 to 10 and the optional embodiments.

Reference to FIG. 1, 8 to 10, a display panel disclosed in one embodiment includes: an encapsulation layer 31; a negative electrode layer 32, disposed on the encapsulation layer 31; light-emitting diodes 33, disposed on the negative electrode layer 32; a positive electrode layer 34, disposed on the light-emitting diodes 33; a driving circuit 35, electrically connected with the negative electrode layer 32 and the positive electrode layer 34; and the light-emitting diodes includes a germanium silicon quantum dot material 14; a proportion range of a silicon element in the light-emitting diodes are 65%-90%, and a proportion range of a germanium element is 10%-35%.

In one or more embodiments, the light-emitting diodes 33 includes a blue luminescent layer 36, and the germanium silicon quantum dot material is doped in the blue luminescent layer 36.

In one or more embodiments, the blue luminescent layer 36 includes a silicon dioxide framework 10, the silicon dioxide framework 10 is made of a mesoporous material (namely a mesoporous silica material). The germanium silicon quantum dot material 14 is formed in the silicon dioxide framework 10, the silicon dioxide framework 10 includes a plurality of cylindrical holes 12, the holes 12 pass through the silicon dioxide framework 10, the holes 12 are filled with the germanium silicon quantum dot material 14, geranium and silicon elements are also embedded in silicon dioxide hole walls 11. The silicon dioxide framework 10 includes a plurality of the cylindrical holes 12, the holes 12 pass through the silicon dioxide framework 10, the holes 12 are filled with the germanium silicon quantum dot material 14. A hole 12 structure is adapted to so that a self-assembly molecule template solution oxide is conveniently adapted to implement, the holes 12 may be cylindrical, or polygonal, the hole structures in different shapes may be manufactured according to different manufacturing technologies and product requirements, so, various shapes of the hole 12 structures fall within a scope of the conception of the mode of execution.

In one or more embodiments, the holes 12 are arranged in a hexagon rule. A honeycomb-like structure may be formed according to the arrangement of the hexagon rule, and good in stability.

In one or more embodiments, a diameter range of holes 12 is D1: 2-7 nanometers; a wall thickness range of the holes 12 is D2: 1-2 nanometers. The wall thickness range of the holes 12 is 1-2 nanometers. The holes 12 and the hole walls are inappropriate because of a too large size and a too small size, the performance of a blue luminescent layer 36 may be guaranteed while the diameter range of the holes 12 is 2-7 nanometers, and the wall thickness range of the holes 12 is 1-2 nanometers.

In one or more embodiments, a molecule template 13 includes hole walls manufactured and formed by a silicon dioxide material; the hole walls are provided with a nanocrystal 15 of an indium gallium zinc oxide (IGZO) material, the nanocrystal 15 contains chemical elements of germanium and silicon. The molecule template 13 also adopts a hollow structure, so that the nanocrystal 15 of the IGZO material may be more uniformly mixed with mesoporous silica, and the conductivity is improved.

A quantum dot is a zero-dimension system in a low-dimension limit system, a typical structure is limited within 100 nm of an area in dimension, and less than a mean free path of an electron (a mean motion path of the electron between two times of collision). The quantum dot is formed by one or more semiconductors, and different light emitting colors may be acquired by controlling a size of the quantum dot.

While a semiconductor material is irradiated by a beam of light, after a photon is absorbed by the semiconductor material, the electron on a valence band of the photon is immigrated to a conduction band, the electron on the conduction band may also emit the photon while immigrated to the second valence band, or may be fallen into an electron trap of the semiconductor material.

A charge injection principle of the quantum dot may be introduced by the following three processes.

A first step: while a positive outgoing bias voltage is applied, a hole and an electron overcome an energy barrier of an interface, and through anode and cathode injection, respectively enter a valence band energy level of a hole transport layer and a conduction band energy level of an electron transport layer.

A second step: the hole and the electron enable the interface to accumulate charge because of an energy level difference of an external electric field.

A third step: after the electron and the hole are combined again in the quantum dot, an exciton is formed, a sub-excited state is unstable in a general environment, energy is released in the manner of light or heat and returned to a stable ground state, so electroluminescence is a current drive phenomenon.

According to a silicon dioxide framework self-assembly molecule template technology, mesoporous silica has a specific pore canal structure, and is hollow, small in density and large in specific surface area, so the mesoporous silica has the unique permeability, the molecule sieving capacity, the optical property and the adsorbability, features of the blue luminescent layer may be remarkably improved, and a germanium material is high in electronic mobility, the light-emitting efficiency of the QLED may be improved, so the conductivity of a backlight source of the QLED may be effectively improved by the combination of two parties, thereby the composite performance of the QLED is improved, and the service life of the QLED is improved. The mode of execution adopts the self-assembly molecule template technology of a regular Nano IGZO (GE, SiGe), as an IGZO source of a precursor of an object, so a silicon-hydroxyl functional group positioned on the surface of a molecule template of a subject may be converted to Nano-dots needed by Si-(IGZO)x, Ge, and Si. So the conductivity of the blue luminescent layer is remarkably improved, and the performance of the QLED is improved.

Figure 2:
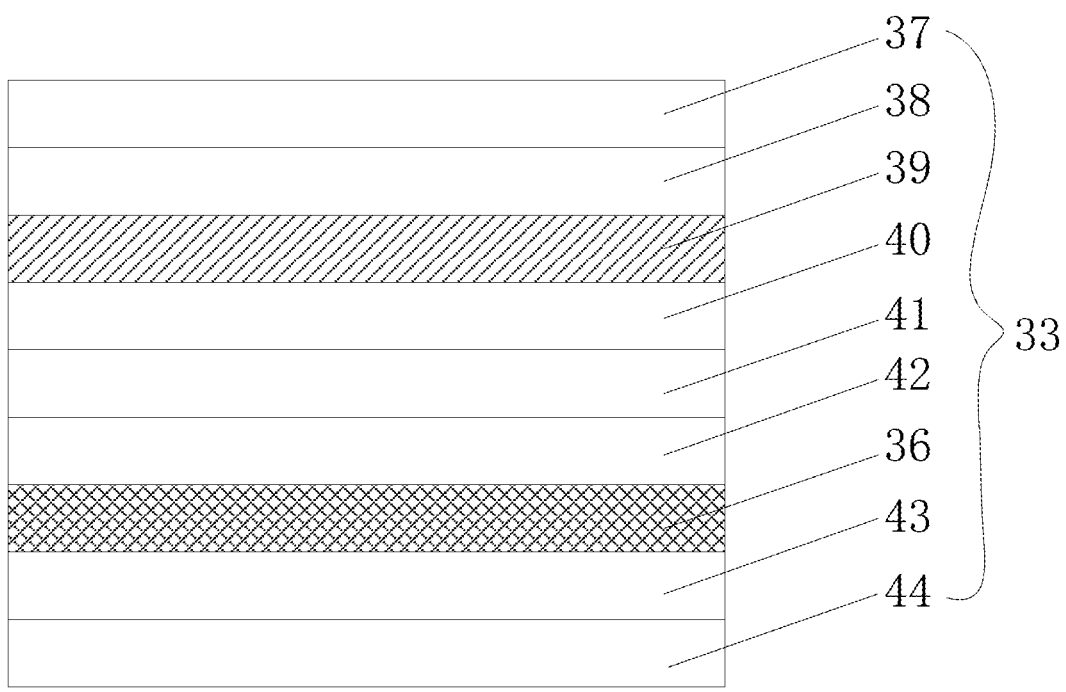
FIG. 2 is a structure schematic diagram of the light-emitting diodes of one embodiment of the present application.

FIG. 2 shows the specific light-emitting diodes structure disclosed in one embodiment, the light-emitting diodes structure includes: an electron injection layer 37, electrically connected with the negative electrode layer 32; a first electron transport layer 38, formed on the electron injection layer 37; a red/green luminescent layer 39, formed on the electron transport layer; a first hole transport layer 40, formed on the red/green luminescent layer 39; an intermediate connection layer 41, formed on the first hole transport layer 40; a second electron transport layer 42, formed on the intermediate connection layer 41, where a blue luminescent layer 36 is formed on the electron transport layer; a second hole transport layer 43, formed on the blue luminescent layer 36; and a hole injection layer 44, formed on the second hole transport layer 43, and electrically connected with the positive electrode layer 34.

A specific structure of the blue luminescent layer 36 may reference to the above mode of execution, and is not repeatedly described herein.

Figure 3:
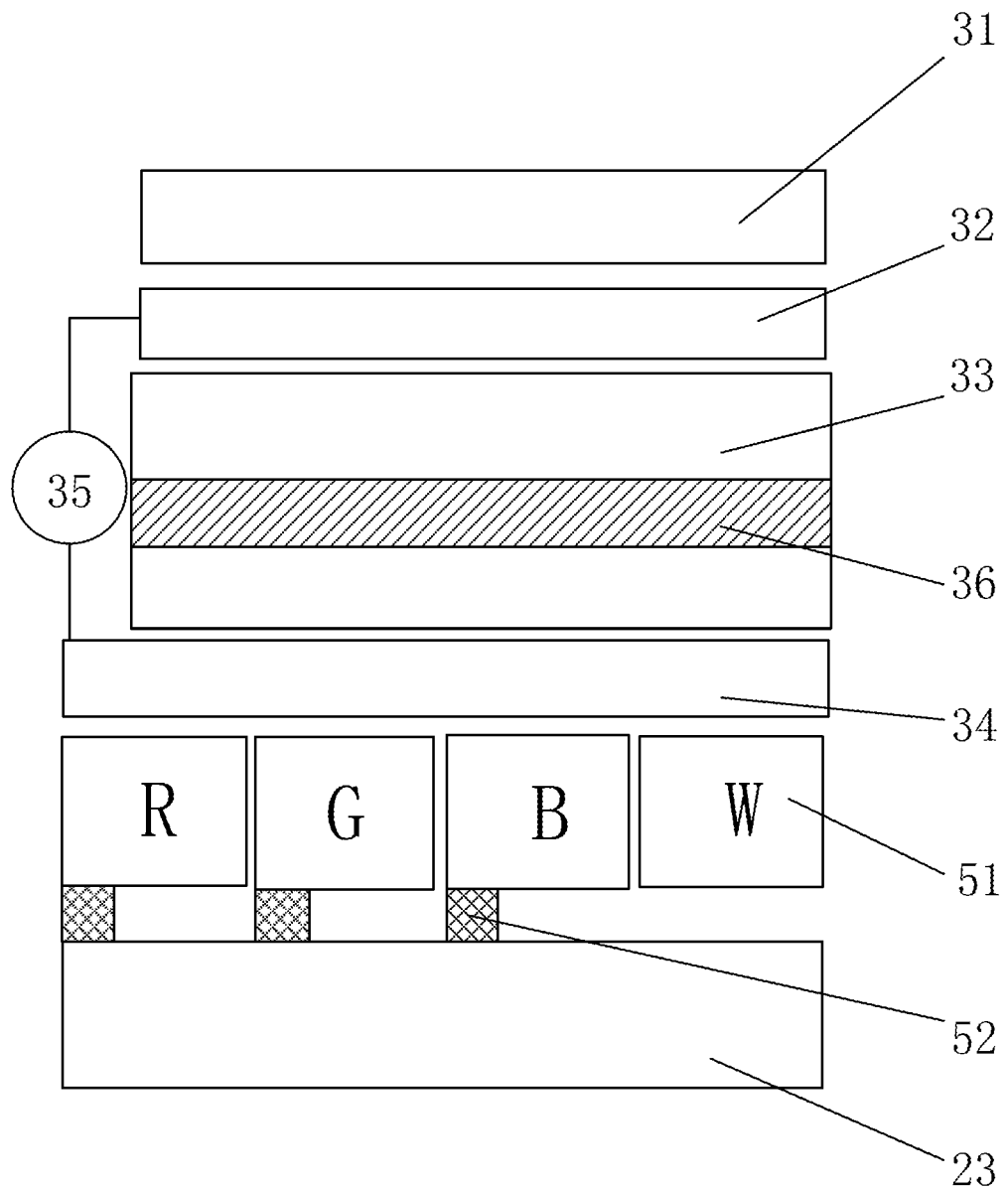
FIG. 3 is a structure schematic diagram of a display device of one embodiment of the present application.

Reference to FIG. 3, a display device disclosed by the mode of execution includes a display panel, and the display panel of the present application. The display panel includes: a substrate 23; multiple active switches 52, formed on the substrate 23; and multiple color filter layers 51, formed on the active switches 52, where in the color filter layers 51, R is a red color filter, G is a green color filter, B is a blue color filter, and W is a white color filter.

The positive electrode layer 34 covers the upper side of the multiple color filter layers 51, the positive electrode layer 34 is made of a transparent conducting material, for example, Indium Tin Oxides (ITO). Specific structures of the display panel and the blue luminescent layer may reference to the above mode of execution, and are not repeatedly described herein.

Figure 4:
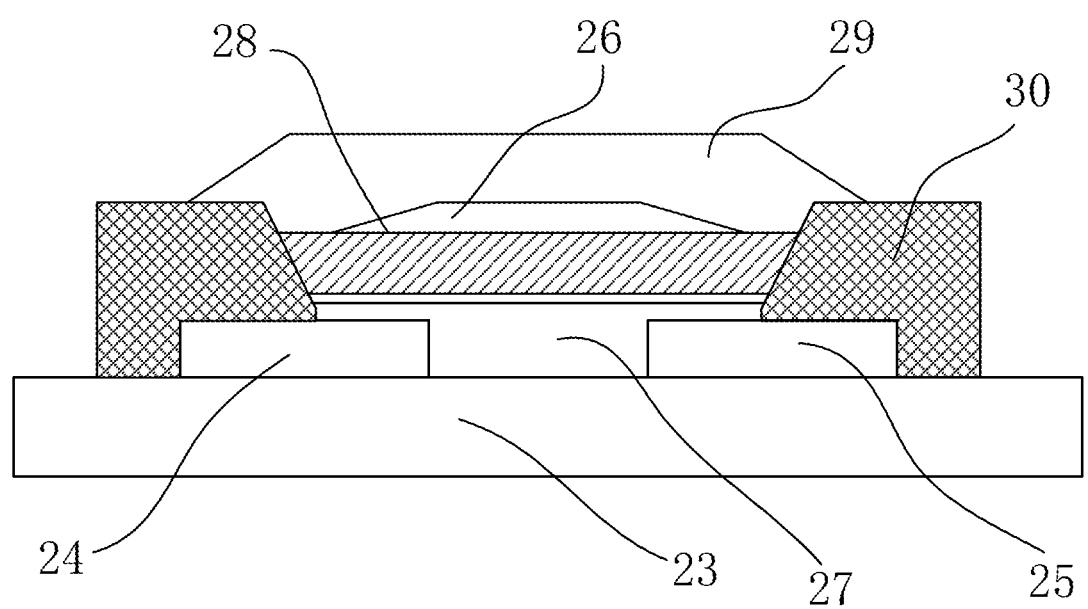
FIG. 4 is a structure schematic diagram of the active switches of one embodiment of the present application.

FIG. 4 shows a specific structure of the active switches disclosed in one embodiment, the active switches includes: a source electrode 24 and a drain electrode 25, formed on a substrate 23 of a display panel; two protecting layers 30, formed on the substrate 23 and partially covering the source electrode 24 and the drain electrode 25, where a groove structure is formed between the two protecting layers 30; a semiconductor layer 27, disposed between the two protecting layers 30, and connecting the source electrode 24 and the drain electrode 25; a dielectric layer 28, disposed between the two protecting layers 30, and formed on the semiconductor layer 27; a gate electrode 26, formed on the dielectric layer 28; and a passivation layer 29, formed on the gate electrode 26.

The semiconductor layer 27 includes a silicon dioxide framework 10, and a synthetic Nano-materials containing an IGZO is internally disposed in the silicon dioxide framework 10. The silicon dioxide framework 10 has a specific pore canal structure, and is hollow, small in density and large in specific surface area, so the silicon dioxide framework has the unique permeability, the molecule sieving capacity, the optical property and the adsorbability, features of the semiconductor layer 27 may be remarkably improved. The mode of execution adopts the self-assembly molecule template technology of a regular Nano IGZO (GE, SiGe), as an IGZO source of a precursor of an object, so a silicon-hydroxyl functional group positioned on the surface of a molecule template 13 of a subject may be converted to Nano-dots needed by Si-(IGZO)x, Ge, and Si. So the conductivity of the semiconductor layer 27 is remarkably improved, thereby the performance of TFT is improved.

Figure 5:
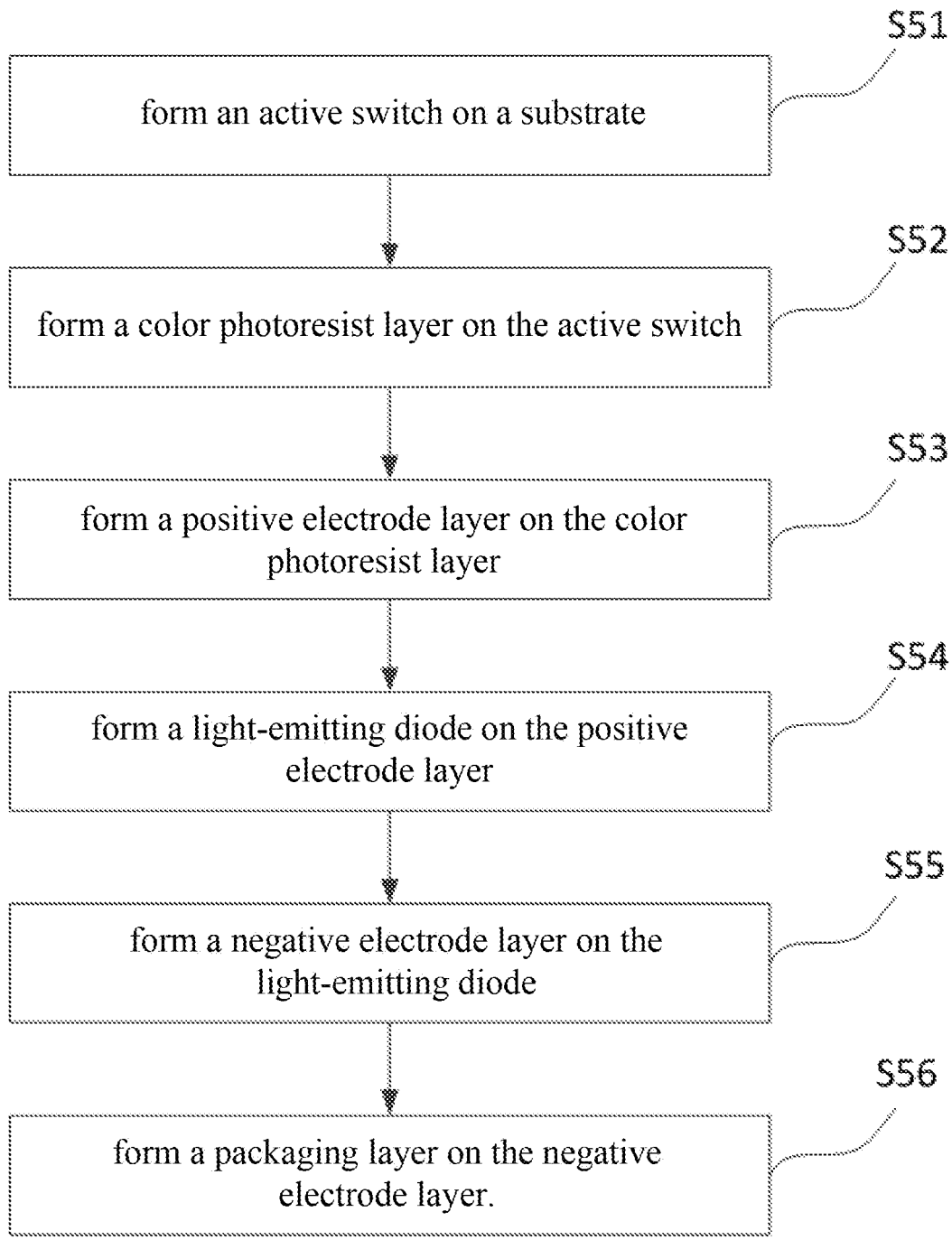
FIG. 5 is a schematic diagram of a manufacturing method for the display panel of one embodiment of the present application.
Figure 6:
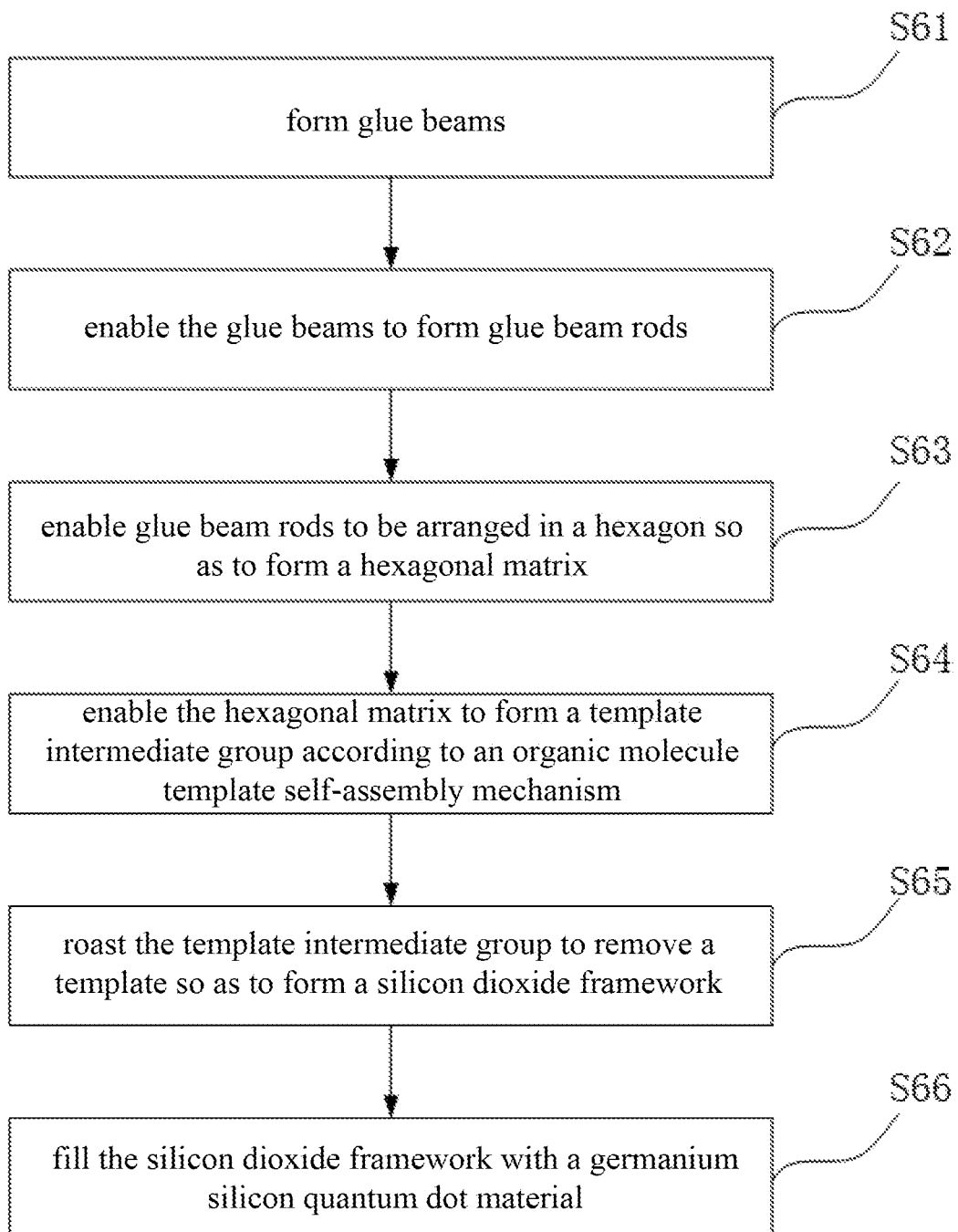
FIG. 6 is a schematic diagram of a manufacturing method for the light-emitting diodes of one embodiment of the present application.
Figure 7:
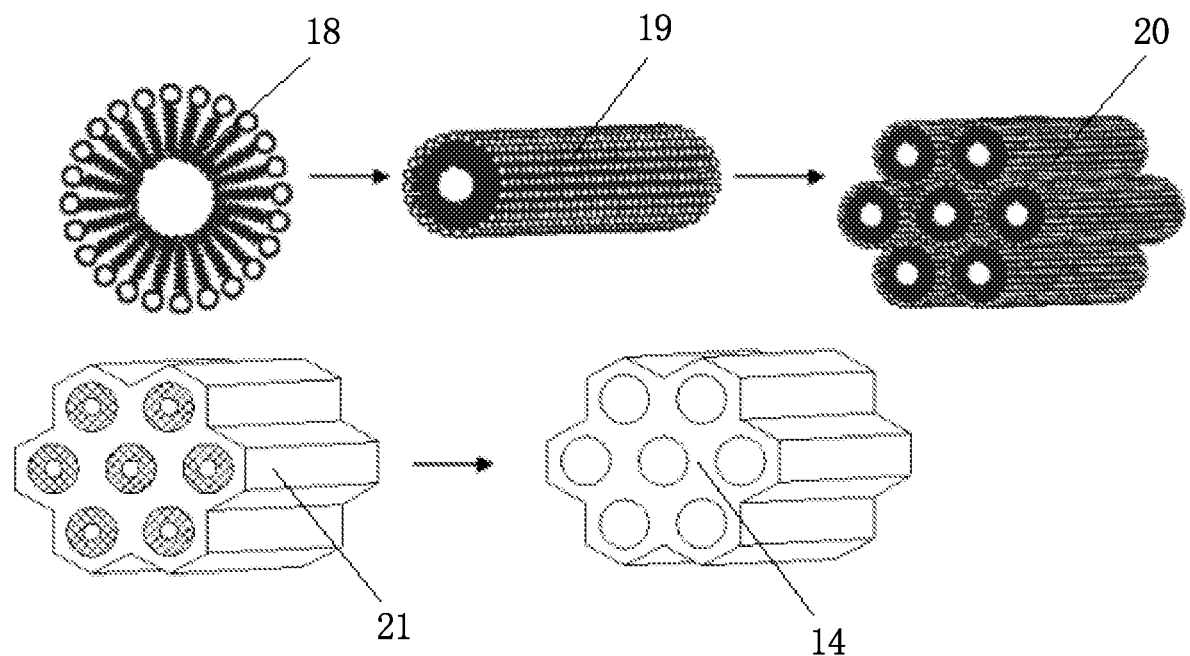
FIG. 7 is a flow schematic diagram of a regular microscopic-silicon dioxide framework by a self-assembly molecule template method according to one embodiment of the present application.
Figure 8:
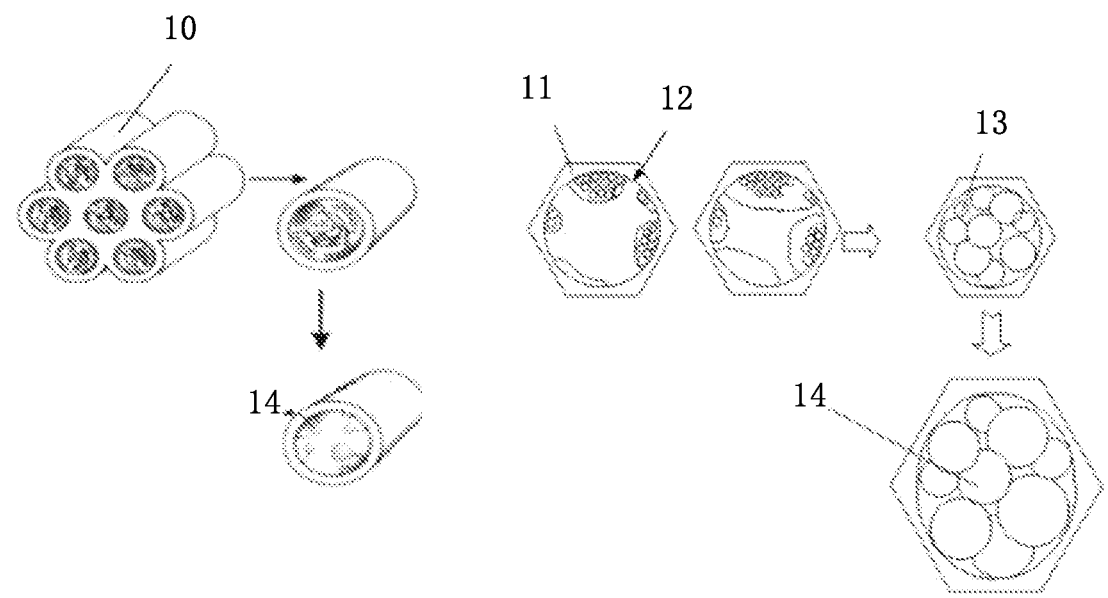
FIG. 8 is a schematic diagram of a self-assembly mesoporous silica framework technology of one embodiment of the present application.
Figure 9:
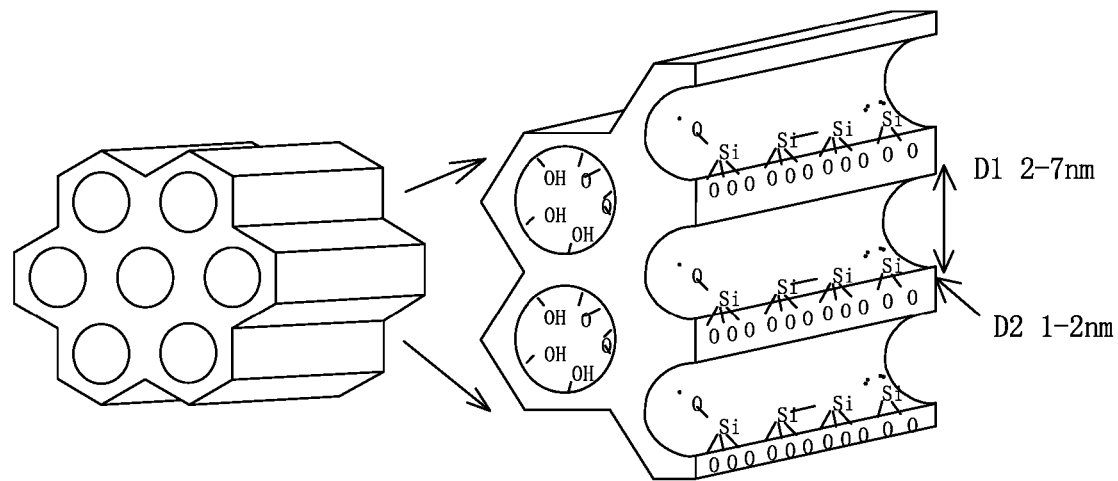
FIG. 9 is a schematic diagram of a preparation method for a Nano porous silicon dioxide medium of one embodiment of the present application.
Figure 10:
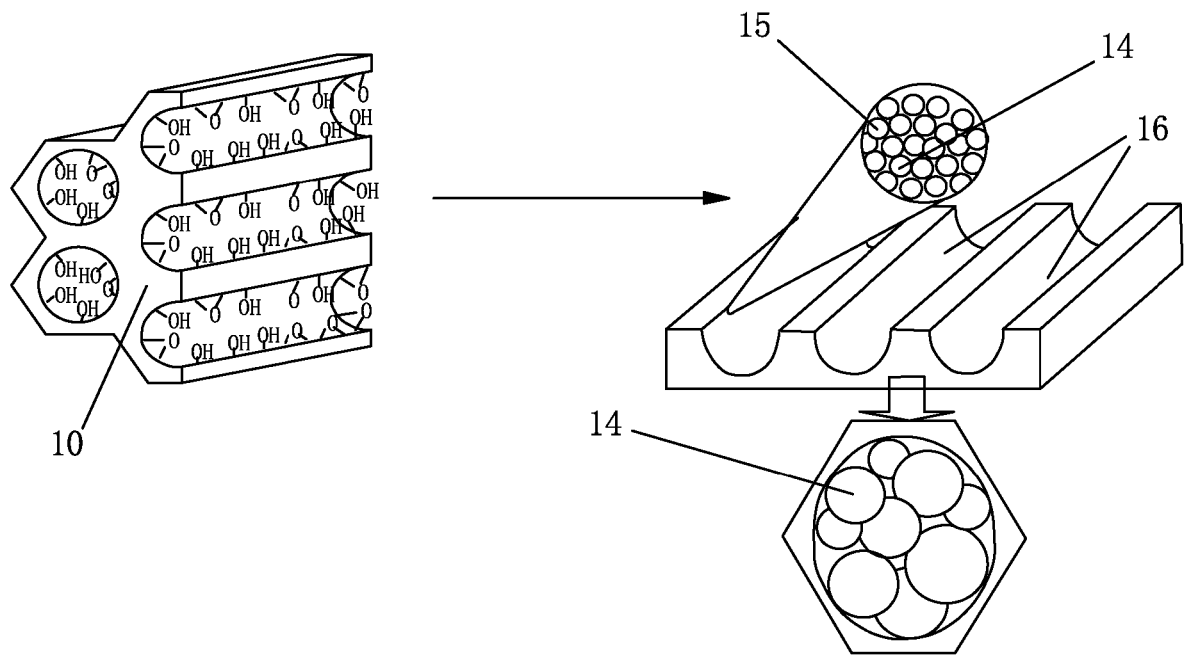
FIG. 10 is a flow schematic diagram of the regular microscopic-silicon dioxide framework by the self-assembly molecule template method according to one embodiment of the present application.

Reference to FIG. 5, a manufacturing method for a display panel disclosed in one embodiment includes the following steps:

S51, forming active switches on a substrate;

S52, forming a color filter layer on the active switches;

S53, forming a first electrode layer on the color filter layer;

S54, forming light-emitting diodes on the first electrode layer;

S55, forming a second electrode layer on the light-emitting diodes; and

S56, forming an encapsulation layer on the second electrode layer.

The light-emitting diodes includes a germanium silicon quantum dot material.

According to a silicon dioxide framework self-assembly molecule template technology of the present application, mesoporous silica has a specific pore canal structure, and is hollow, small in density and large in specific surface area, so the mesoporous silica has the unique permeability, the molecule sieving capacity, the optical property and the adsorbability, features of the blue luminescent layer may be remarkably improved, and a germanium material is high in electronic mobility, the light-emitting efficiency of the QLED may be improved, so the conductivity of a backlight source of the QLED may be effectively improved by the combination of two parties, thereby the composite performance of the QLED is improved, and the service life of the QLED is improved. A specific structure of the blue luminescent layer may reference to the above mode of execution, and is not repeatedly described herein.

Reference to FIG. 6 to 10, a manufacturing method for a blue luminescent layer 36 of the light-emitting diodes 33 disclosed by the present application includes the following steps:

S61, forming glue beams 18;

S62, enabling the glue beams 18 to form glue beam rods 19:

S63, enabling glue beam rods 19 to be arranged in a hexagon so as to form a hexagonal matrix 20;

S64, enabling the hexagonal matrix 20 to form a template intermediate group 21 according to an organic molecule template self-assembly mechanism;

S65, roasting the template intermediate group to remove a template so as to form a silicon dioxide framework 10; and S66, filling the silicon dioxide framework 10 with a germanium silicon quantum dot material 14.

The hexagonal matrix formed by the glue beam rods 19 is adapted to as the template, the template itself is a setting agent, as well as a stabilizer, expected control to a material structure may be realized by changing a shape and a size of the template. In addition, an experimental apparatus is simple, and the operation is easy. The glue beam rods 19 may be recycled, so the waste is reduced, the cost is reduced and the environmental pollution is reduced. Specific structures of the display panel and the blue luminescent layer may reference to the above mode of execution, and are not repeatedly described herein.

In the above embodiment, the active switches may be a thin film transistor, and the display panel may include a liquid crystal panel, a plasma panel, an OLED panel, a QLED panel and the like. In addition, the display panel may be a plane-type panel, or a curved-type panel.

The above content is the optional detailed description to the present application in combination with the specific optional mode of execution, and the specific implementation of the present application may not be designated to be limited to these descriptions. A plurality of simple deduction or replacement to the present application may also be made by those of ordinary skill in the art under the precondition without departing from a conception of the present application, and should be considered to fall within a scope of protection of the present application.

What is claimed is:

1. A display panel, comprising:
a substrate;
active switches, formed on the substrate;
a color filter layer, formed on the active switches;
a first electrode layer, formed on the color filter layer;
light-emitting diodes, formed on the first electrode layer;
a second electrode layer, formed on the light-emitting diodes; and
an encapsulation layer, formed on the second electrode layer;
wherein the light-emitting diodes comprises a germanium silicon quantum dot material;
a proportion range of a silicon element in the light-emitting diodes is 65%-90%, and a proportion range of a germanium element is 10%-35%.

2. The display panel according to claim 1, wherein the light-emitting diodes further comprising:
an electron injection layer, electrically connected with the second electrode layer;
a first electron transport layer, formed on the electron injection layer;
a red/green luminescent layer, formed on the first electron transport layer;
a first hole transport layer, formed on the red/green luminescent layer;
an intermediate connection layer, formed on the first hole transport layer;
a second electron transport layer, formed on the intermediate connection layer;
a blue luminescent layer, formed on the electron transport layer;
a second hole transport layer, formed on the blue luminescent layer; and
a hole injection layer, formed on the second hole transport layer, and electrically connected with the first electrode layer.

3. The display panel according to claim 2, wherein the blue luminescent layer comprises a silicon dioxide framework, the germanium silicon quantum dot material is formed in the silicon dioxide framework, the silicon dioxide framework comprises a plurality of cylindrical holes, the holes pass through the silicon dioxide framework, and the holes are filled with the germanium silicon quantum dot material.

4. The display panel according to claim 3, wherein the holes are arranged in a hexagon rule.

5. The display panel according to claim 3, wherein a diameter range of the holes is 2-7 nanometers; and a wall thickness of the holes is 1-2 nanometers.

6. The display panel according to claim 2, wherein the red/green luminescent layer comprises a silicon dioxide framework, the germanium silicon quantum dot material is formed in the silicon dioxide framework, the silicon dioxide framework comprises a plurality of cylindrical holes, the holes pass through the silicon dioxide framework, and the holes are filled with the germanium silicon quantum dot material.

7. The display panel according to claim 1, wherein the light-emitting diodes further comprises: an electron injection layer electrically connected with the second electrode layer, an electron transport layer formed on the electron injection layer, a red/green luminescent layer formed on the electron transport layer, a first hole transport layer formed on the red/green luminescent layer, an intermediate connection layer formed on the first hole transport layer, an electron transport layer formed on the intermediate connection layer, where a blue luminescent layer is formed on the electron transport layer, a second hole transport layer formed on the blue luminescent layer, and a hole injection layer formed on the second hole transport layer, wherein the hole injection layer is electrically connected with the first electrode layer; and
the blue luminescent layer comprises a silicon dioxide framework, the germanium silicon quantum dot material is formed in the silicon dioxide framework, the silicon dioxide framework comprises a plurality of cylindrical holes, the holes pass through the silicon dioxide framework, and the holes are filled with the germanium silicon quantum dot material, the holes are arranged in a hexagon rule, a diameter range of the holes is 2-7 nanometers; and a wall thickness of the holes is 1-2 nanometers.

8. The display panel according to claim 1, wherein the active switches comprising:
a source electrode and a drain electrode, formed on the substrate of the display panel;
two protecting layers, formed on the substrate and partially covering the source electrode and the drain electrode, wherein a groove structure is formed between the two protecting layers;
a semiconductor layer, disposed between the two protecting layers, and connecting the source electrode and the drain electrode;
a dielectric layer, disposed between the two protecting layers, and formed on the semiconductor layer;
a gate electrode, formed on the dielectric layer; and
a passivation layer, formed on the gate electrode;
the semiconductor layer comprises a silicon dioxide framework, and a synthetic Nano-materials containing an indium gallium zinc oxide is internally disposed in the silicon dioxide framework.

9. A manufacturing method for a display panel, comprising:
forming active switches on a substrate;
forming a color filter layer on the active switches;
forming a first electrode layer on the color filter layer;
forming light-emitting diodes on the first electrode layer;
forming a second electrode layer on the light-emitting diodes;
forming an encapsulation layer on the second electrode layer; and
the light-emitting diodes comprises a germanium silicon quantum dot material.

10. The manufacturing method for the display panel according to claim 9, wherein the first electrode layer comprises a blue luminescent layer, and wherein the step of forming the light-emitting diodes on the first electrode layer comprises the following operations of manufacturing the blue luminescent layer:
forming glue beams;
enabling the glue beams to form glue beam rods;
enabling the glue beam rods to be arranged in hexagon so as to form a hexagonal matrix;
enabling the hexagonal matrix to form a template intermediate group according to an organic molecule template self-assembly mechanism;
roasting the template intermediate group to remove a template so as to form a silicon dioxide framework; and
filling the silicon dioxide framework with a germanium silicon quantum dot material.

11. A display device, the display device comprises a display panel, comprising:

a substrate;

active switches, formed on the substrate;

a color filter layer, formed on the active switches;

a first electrode layer, formed on the color filter layer;

light-emitting diodes, formed on the first electrode layer;

a second electrode layer, formed on the light-emitting diodes; and an encapsulation layer, formed on the second electrode layer;

the light-emitting diodes comprises a germanium silicon quantum dot material;

a proportion range of a silicon element in the light-emitting diodes is 65%-90%, and a proportion range of a germanium element is 10%-35%.

12. The display device according to claim 11, wherein the light-emitting diodes further comprising:

an electron injection layer, electrically connected with the second electrode layer;

a first electron transport layer, formed on the electron injection layer;

a red/green luminescent layer, formed on the first electron transport layer;

a first hole transport layer, formed on the red/green luminescent layer;

an intermediate connection layer, formed on the first hole transport layer;

a second electron transport layer, formed on the intermediate connection layer;

a blue luminescent layer, formed on the electron transport layer;

a second hole transport layer, formed on the blue luminescent layer; and a hole injection layer, formed on the second hole transport layer, and electrically connected with the first electrode layer.

13. The display device according to claim 12, wherein the blue luminescent layer comprises a silicon dioxide framework, the germanium silicon quantum dot material is formed in the silicon dioxide framework, the silicon dioxide framework comprises a plurality of cylindrical holes, the holes pass through the silicon dioxide framework, and the holes are filled with the germanium silicon quantum dot material.

14. The display device according to claim 13, wherein the holes are arranged in a hexagon rule.

15. The display device according to claim 13, wherein a diameter range of the holes is 2-7 nanometers; and a wall thickness of the holes is 1-2 nanometers.

16. The display device according to claim 12, wherein the red/green luminescent layer comprises a silicon dioxide framework, the germanium silicon quantum dot material is formed in the silicon dioxide framework, the silicon dioxide framework comprises a plurality of cylindrical holes, the holes pass through the silicon dioxide framework, and the holes are filled with the germanium silicon quantum dot material.

17. The display device according to claim 11, wherein the light-emitting diodes further comprises: an electron injection layer electrically connected with the second electrode layer, an electron transport layer formed on the electron injection layer, a red/green luminescent layer formed on the electron transport layer, a first hole transport layer formed on the red/green luminescent layer, an intermediate connection layer formed on the first hole transport layer, an electron transport layer formed on the intermediate connection layer, where a blue luminescent layer is formed on the electron transport layer, a second hole transport layer formed on the blue luminescent layer, and a hole injection layer formed on the second hole transport layer, wherein the hole injection layer is electrically connected with the first electrode layer; and the blue luminescent layer comprises a silicon dioxide framework, the germanium silicon quantum dot material is formed in the silicon dioxide framework, the silicon dioxide framework comprises a plurality of cylindrical holes, the holes pass through the silicon dioxide framework, and the holes are filled with the germanium silicon quantum dot material, the holes are arranged in a hexagon rule, a diameter range of the holes is 2-7 nanometers; and a wall thickness of the holes is 1-2 nanometers.

18. The display device according to claim 11, wherein the active switches comprising:

a source electrode and a drain electrode, formed on the substrate of the display panel;

two protecting layers, formed on the substrate and partially covering the source electrode and the drain electrode, wherein a groove structure is formed between the two protecting layers;

a semiconductor layer, disposed between the two protecting layers, and connecting the source electrode and the drain electrode;

a dielectric layer, disposed between the two protecting layers, and formed on the semiconductor layer;

a gate electrode, formed on the dielectric layer; and a passivation layer, formed on the gate electrode;

the semiconductor layer comprises a silicon dioxide framework, and a synthetic Nano-materials containing an indium gallium zinc oxide is internally disposed in the silicon dioxide framework.

* * * * *